United States Patent
Kishi et al.

[19]

[11] Patent Number: 5,969,553

[45] Date of Patent: Oct. 19, 1999

[54] DIGITAL DELAY CIRCUIT AND DIGITAL PLL CIRCUIT WITH FIRST AND SECOND DELAY UNITS

[75] Inventors: Toshio Kishi; Yukihiko Shimazu, both of Tokyo, Japan

[73] Assignee: Mitsubishi Denki Kabushiki Kaisha, Tokyo, Japan

[21] Appl. No.: 08/985,276

[22] Filed: Dec. 4, 1997

[30] Foreign Application Priority Data

Jun. 20, 1997 [JP] Japan ..................................... 9-164145

[51] Int. Cl.⁶ ...................................................... H03L 7/06
[52] U.S. Cl. .......................... 327/159; 327/158; 375/376; 331/25; 331/DIG. 2
[58] Field of Search ...................................... 327/147, 149, 327/150, 156, 158, 159; 375/373, 374, 376; 331/4, 17, 25, 18, DIG. 2

[56] References Cited

U.S. PATENT DOCUMENTS 5,604,775   2/1997   Saitoh et al. ............................. 375/376

*Primary Examiner*—Timothy P. Callahan
*Assistant Examiner*—Minh Nguyen
*Attorney, Agent, or Firm*—Burns, Doane, Swecker & Mathis, LLP

[57] ABSTRACT

A digital delay circuit and a digital PLL circuit achieve reduction in size and power consumption. Each of a first delay line (301) and a second delay line (302) includes a plurality of delay elements. A control circuit (200) selects the delay element(s) included in a delay line (300), and a second clock signal (S11) passes only through the selected delay element(s). That is, the second clock signal (S11) does not pass through the non-selected delay element(s), which reduces power consumption.

10 Claims, 11 Drawing Sheets

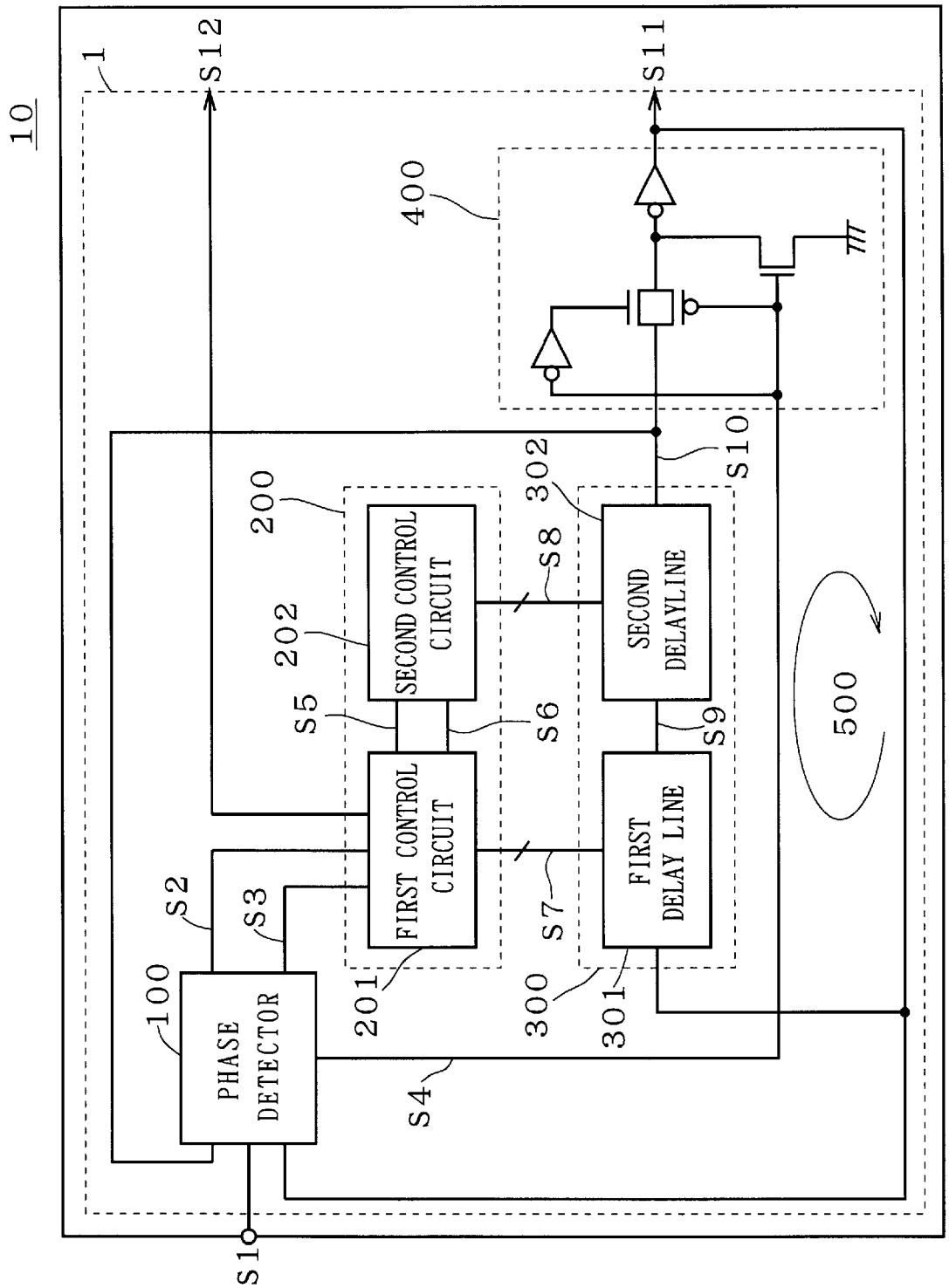
F I G. 1

DIGITAL DELAY CIRCUIT AND DIGITAL PLL CIRCUIT WITH FIRST AND SECOND DELAY UNITS

BACKGROUND OF THE INVENTION

1. Field of the Invention

The present invention is directed to a digital delay circuit wherein the amount of delay can be variably set by a digital value, and also to a digital PLL (phase lock loop) circuit for generating an internal clock which follows a phase of an external clock.

2. Background of the Invention

A conventional digital PLL circuit, as set forth, for example, in U.S. Pat. No. 5,422,835, uses a pulse produced by shifting a phase by a plurality of delay lines, to generate an output signal dividing a cycle of the external clock.

FIG. 11 is a circuit diagram showing a conventional digital PLL circuit 900 introduced by U.S. Pat. No. 5,422, 835. With reference to this figure, variable delay lines 1 through 3 generate pulses PG13, PG23 and PG33 having phase differences of 120°, 240°, and 360°, respectively. Then, with a toggle latch from a logical sum of the pulses PG13, PG23 and PG33, an output signal dividing a cycle of an external clock signal EXTR into one and half is generated.

Thus, a total amount of delay of the variable delay lines 1 through 3 has to correspond to one cycle of the external clock. Further, each of the three delay lines includes delay portions of the same delay amount.

In this way, the conventional digital PLL circuit 900 requires the delay lines having the same delay amount with one cycle of the external clock. Thus, the number of delay portions increases as one cycle of the external clock becomes longer, which increases the size of the circuit. Moreover, variable potential at each node in the delay lines increases power consumption in the digital PLL circuit.

SUMMARY OF THE INVENTION

A first aspect of the present invention is directed to a digital delay circuit. The digital delay comprises: a control circuit receiving a digital signal which changes the amount of delay and for taking a count in accordance with the digital signal to output a count value; and a delay line receiving a delay object signal and the count value, and comprising a first delay line including a plurality of first delay portions each having a first delay unit, and a second delay line including a plurality of second delay portions each having a second delay unit corresponding to a predetermined number of the first delay units, wherein the delay line passes the delay object signal through the first delay portions the number of which is indicated by a lower digit of the count value and through the second delay portions the number of which is indicated by an upper digit of the count value, to output the delay object signal.

Preferably, according to a second aspect of the present invention, the control circuit comprises an initial value setting portion for setting the lower digit to a predetermined initial value when the lower digit overflows.

Preferably, according to a third aspect of the present invention, the initial value is such that the lower digit overflows when changed by the predetermined number from the initial value.

Preferably, according to a fourth aspect of the present invention, the control circuit comprises: a first control circuit receiving the digital signal and for taking a count in accordance with the digital signal to output the lower digit, if the lower digit overflows, to output a control signal for selecting either to count up or down in count operation; and a second control circuit receiving the control signal and for taking a count in accordance with the control signal to output the upper digit.

Preferably, according to a fifth aspect of the present invention, the first control circuit includes a first up-down counter for taking a count to output the lower digit; and the second control circuit includes a second up-down counter for taking a count to output the upper digit.

Preferably, according to a sixth aspect of the present invention, the delay line includes a potential fixing portion for fixing an input potential of only the first and second delay portions through which the delay object signal does not pass.

A seventh aspect of the present invention is directed to a digital PLL circuit receiving a first clock signal and for generating a second clock signal which follows the phase of the first clock signal. The digital PLL circuit comprises: a digital delay circuit; and a phase compare portion receiving the first and second clock signals and for making a phase comparison between the first and second clock signals to output the compared result as a digital signal which changes the amount of delay. The digital delay circuit comprises a control circuit receiving a digital signal which changes the amount of delay and for taking a count in accordance with the digital signal to output a count value; and a delay line receiving a delay object signal and the count value and comprising a first delay line including a plurality of first delay portions each having a first delay unit, and a second delay line including a plurality of second delay portions each having a second delay unit corresponding to a predetermined number of the first delay units, wherein the delay line passes the delay object signal through the first delay portions the number which is indicated by a lower digit of the count value and through the second delay portions the number of which is indicated by an upper digit of the count value, to output the delay object signal, and wherein the delay object signal is the second clock signal.

Preferably, according to an eighth aspect of the present invention, the phase compare portion includes a pulse counter receiving the first and second clock signals and for detecting whether a pulse count of the second clock signal taken in one cycle of the first clock signal reaches a predetermined target value. The phase compare portion also generates the digital signal on the basis of the detected result of the pulse counter.

Preferably, according to a ninth aspect of the present invention, the phase compare portion further includes a pulse phase compare portion receiving the detected result of the pulse counter and the first and second clock signals, and for making a phase comparison between the first and second clock signals if the detected result of the pulse counter indicates that the pulse count reaches a predetermined target value. The phase compare portion also generates the detected result of the pulse phase compare portion as the digital signal.

Preferably, according to a tenth aspect of the present invention, the digital PLL circuit of the ninth aspect further comprises: a clock signal stop portion receiving the detected result and for stopping the second clock signal in accordance with the detected result.

Preferably, according to an eleventh aspect of the present invention, the control circuit comprises an interrupt signal output portion for generating an interrupt signal for making an interruption in a system equipped with the digital PLL circuit, when the upper digit changes by taking a count.

In accordance with the first aspect of the present invention, since one second delay unit of the second delay portion corresponds to a predetermined number of the first delay units of the first delay portion, the amount of delay of the delay line can be set with the first delay unit as one unit. This reduces a total number of the delay portions, and the size of the circuit.

In accordance with the second aspect of the present invention, when the lower digit overflows, a predetermined initial value is set to the lower digit. Thus, the amount of delay of the delay line can be variably altered in accordance with the counted result, that is, whether the value is counted up or down.

In accordance with the third aspect of the present invention, the amount of delay of the delay line can be increased and decreased for every first delay unit.

In accordance with the fourth aspect of the present invention, the size of the circuit can be reduced by forming the control circuit of the first and second control circuits.

In accordance with the fifth aspect of the present invention, for example, the first control circuit formed of the first up-down counter achieves a high-speed operation, while the second control circuit formed of the second up-down counter reduces the size of the circuit.

In accordance with the sixth aspect of the present invention, the potential fixing portion fixes the input potential of the unused delay portions which do not pass the delay object signal, so that power consumption can be reduced.

In accordance with the seventh aspect of the present invention, the presence of the digital delay circuit in the digital PLL circuit brings about reduction in size and power consumption in the digital PLL circuit.

In accordance with the eighth aspect of the present invention, the pulse counter enables generation of the second clock signal dividing the cycle of the first clock signal as well as simplifies the main part of the phase compare portion for making a phase comparison.

In accordance with the ninth aspect of the present invention, the pulse phase compare portion brings about accuracy in the phase comparison made when the phase of the second clock signal follows the phase of the first clock signal.

In accordance with the tenth aspect of the present invention, since the phase when the pulse count of the second clock signal reaches a target value is fixed, the clock signal stop portion brings about accuracy in the phase comparison in the pulse phase compare portion.

In accordance with the eleventh aspect of the present invention, a bad influence on system operation due to a rapid change in the cycle of the second clock signal can be prevented in advance by outputting the interrupt signal when the upper digit is counted up or down.

The object of the present invention is to provide the digital delay circuit and the digital PLL circuit, achieving reduction in size and power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a digital PLL circuit 1 according to a preferred embodiment of the present invention.

DESCRIPTION OF THE PREFERRED EMBODIMENTS

Figure 2:
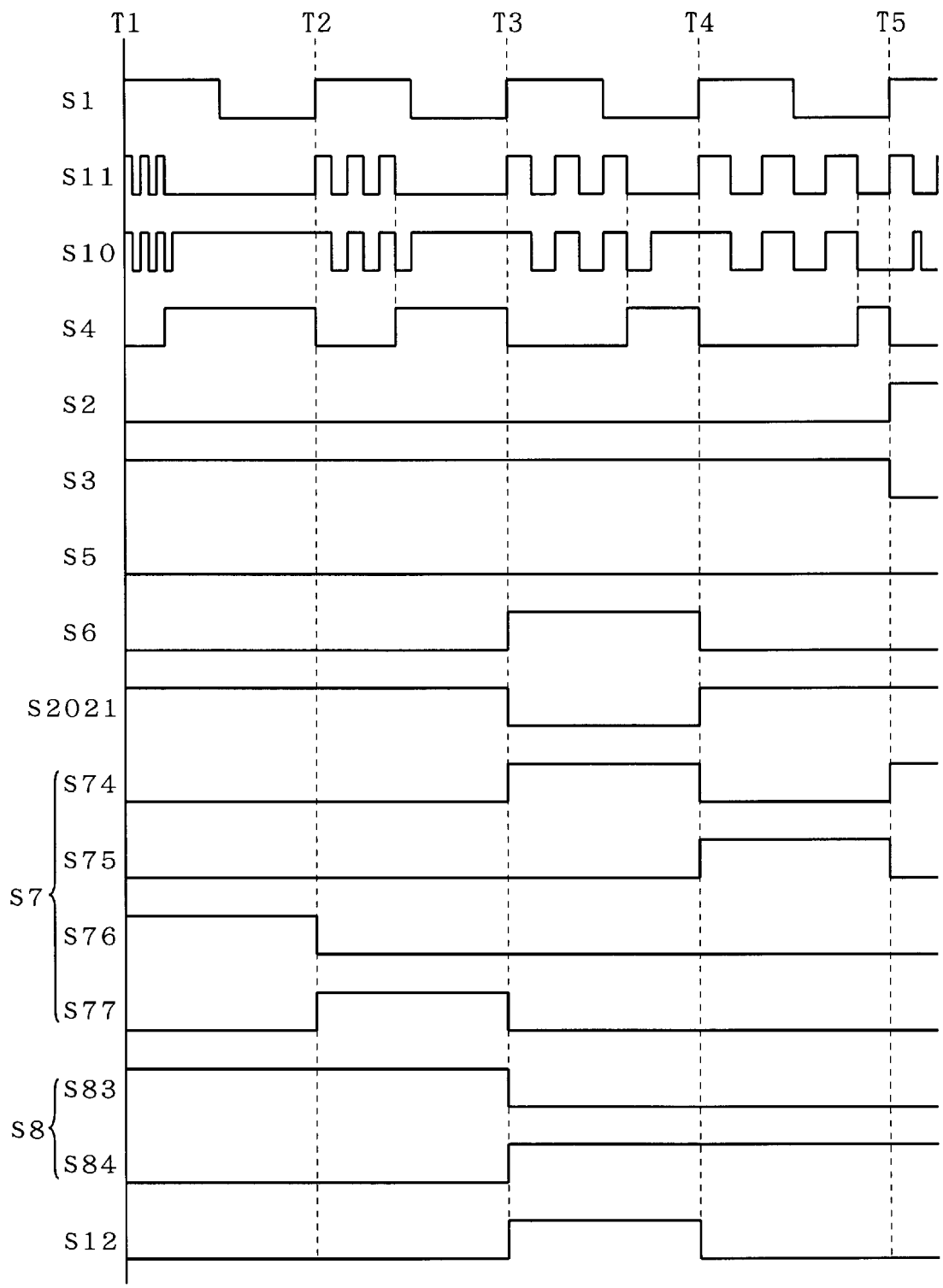
FIG. 2 is a timing chart illustrating an operation of the digital PLL circuit 1.

FIG. 1 shows a digital PLL circuit 1 according to a preferred embodiment of the present invention. A semiconductor chip 10 (system) is equipped with the digital PLL circuit 1. The digital PLL circuit 1 receives a first clock signal S1 (external clock signal) generated outside of the semiconductor chip 10, and generates a second clock signal S11 (internal clock signal) which follows the phase of the first clock signal S1.

First, the structure of the digital PLL circuit 1 will be described. The digital PLL circuit 1 comprises a phase detector or comparator 100 (phase compare portion), a digital delay circuit including a control circuit 200 and a delay line 300, and a clock signal stop circuit 400 (clock signal stop portion).

The phase detector 100 receives the first clock signal S1, the second clock signal S11, and a compare clock signal S10 outputted from the delay line 300, and then makes a phase comparison between the signals S1 and S11 to output a clock stop signal S4, and a digital signal (first frequency-up signal S2 and first frequency-down signal S3) which changes the amount of delay indicative of the compared result.

The reference numeral 500 in the figure indicates a closed loop which connects an output of the delay line 300 and an input of the clock signal stop circuit 400, and also connects an output of the clock signal stop circuit 400 and an input of the delay line 300. Here, the compare clock signal S10 is a second clock signal at a node between the delay line 300 and the clock signal stop circuit 400.

The control circuit 200 receives the first frequency-up signal S2 and the first frequency-down signal S3 to take a count in accordance with those signals, and outputs a low-order signal S7 indicative of a lower digit of the count value and a high-order signal S8 indicative of an upper digit of the count value.

The delay line 300 receives the second clock signal S11 to be a delay object signal, the low-order signal S7, and the high-order signal S8, and outputs the compare clock signal S10.

The clock signal stop circuit 400 receives the compare clock signal S10 and the clock stop signal S4, and outputs the second clock signal S11.

The control circuit 200 comprises a first control circuit 201 and a second control circuit 202. The first control circuit 201 receives the first frequency-up signal S2 and the first frequency-down signal S3 to take a count of a lower digit of the count value in accordance with these signals S2 and S3, and outputs the low-order signal S7 corresponding to the lower digit. If the lower digit of the count value overflows, the first control circuit 201 outputs another digital signal (second frequency-up signal S5 or second frequency-down signal S6) for selecting either to count up or down in count operation. The second control circuit 202 receives the second frequency-up signal S5 and the second frequency-down signal S6 to take a count of an upper digit of the count value, and outputs the high-order signal S8 corresponding to the upper digit. The second frequency-up signal S5 and the second frequency-down signal S6 constitutes a control signal.

The delay line 300 comprises a first delay line 301 and a second delay line 302. The first delay line 301 receives the low-order signal S7 and the second clock signal S11, and outputs a signal S9. The second delay line 302 receives the high-order signal S8 and the signal S9, and outputs the compare signal S10. Here, the signal S9 is a second clock signal at a node between the first delay line 301 and the second delay line 302.

FIG. 2 is a timing chart illustrating operation of the digital PLL circuit 1. Each time T1 through T5 in this figure indicates a rising edge of the first clock signal S1.

First, operation from the time T1 to T2 will be described. At the time T1, supposed that a cycle of the first clock signal S1 is much longer than a cycle of the second clock signal S11, and that the second frequency-up signal S5, the second frequency-down signal S6 and the compare clock signal S10 has been set to "0", "0", and "1", respectively, since before the time T1. When receiving a rising edge of the first clock signal S1, the phase detector 100 outputs a "0" level of the clock stop signal S4 to start detecting a pulse count of the second clock signal S11.

When receiving a "0" level of the first frequency-up signal S2 and a "1" level of the first frequency-down signal S3, the control circuit 200 outputs the low-order signal S7 and the high-order signal S8 indicative of a count value for increasing the amount of delay as compared with that before the time T1. On the other hand, when receiving a "1" level of the first frequency-up signal S2 and a "0" level of the first frequency-down signal S3, the control circuit 200 outputs the low-order signal S7 and the high-order signal S8 indicative of a count value for decreasing the amount of delay as compared with that before the time T1.

The clock signal stop circuit 400, when receiving a "0" level of the clock stop signal S4, outputs a "1" level of the second clock signal S11. The delay line 300 delays the second clock signal S11 for the amount of delay corresponding to the count value indicated by the low-order signal S7 and the high-order signal S8, and outputs an inversed level of the compare clock signal S10. Thus, passing through the closed loop 500, the second clock signal S11 oscillates.

Supposed that the pulse count of the second clock signal S11 reaches three at a certain point between the time T1 and T2. Then, the phase detector 100 detects that the pulse count of the second clock signal S11 becomes equal to a predetermined target value (three in this case), and shifts a level of the clock stop signal S4 from "0" to "1".

When receiving a "1" level of the clock stop signal S4, the clock signal stop circuit 400 fixes the second clock signal S11 at a "0" level. After the delay time corresponding to the amount of delay passes from this moment, the compare clock signal S10 is fixed at a "1" level. In this way, the clock signal stop circuit 400 stops the second clock signal S11 in accordance with the clock stop signal S4.

The same operation described above is performed from the time T2 to T3. Only difference is that, since the control circuit 200 receives a "0" level of the first frequency-up signal S2 and a "1" level of the first frequency-down signal S3, the control circuit 200 outputs the low-order signal S7 and the high-order signal S8 indicative of a count value for further increasing the amount of delay as compared with that before the time T2. Thus, the pulse cycle of the second clock signal S11 increases.

Moreover, when the pulse count of the second clock signal S11 reaches the target value, the phase detector 100 make a phase comparison between the first clock signal S1 and the second clock signal S11 at a rising edge of the first clock signal S1. In the phase comparison, when the compare clock signal S10 is at a "1" level, the phase detector 100 outputs a "0" level of the first frequency-up signal S2 and a "1" level of the first frequency-down signal S3. On the contrary, when the compare clock signal S10 is at a "0" level at a rising edge of the first clock signal S1, the phase detector 100 outputs a "1" level of the first frequency-up signal S2 and a "0" level of the first frequency-down signal S3.

In operations from the time T3 to T4 and from the time T4 to T5, the pulse cycle of the second clock signal S11 increases as is the case with the operation from the time T2 to T3.

Now, operation from the time T5 and later will be described. At the time T5, the compare clock signal S10 is at a "0" level. Thus, the phase detector 100 makes a phase comparison, and outputs a "1" level of the first frequency-up signal S2 and a "0" level of the first frequency-down signal S3 at a rising edge of the first clock signal S1.

Since the control circuit 200 receives a "1" level of the first frequency-up signal S2 and a "0" level of the first frequency-down signal S3, the control circuit 200 outputs the low-order signal S7 and the high-order signal S8 indicative of a count value for decreasing the amount of delay. Thus, the pulse cycle of the second clock signal S11 decreases at this time.

After that, the pulse cycle of the second clock signal S11 increases and decreases before and after the rising edges of the first clock signal S1.

As described above, the digital PLL circuit 1 generates the second clock signal S11, which follows the phase of the first clock signal S1 and divides the cycle of the first clock signal S1 into three, by increasing and decreasing the pulse cycle of the second clock signal S11 before and after the rising edges of the first clock signal.

Figure 3:
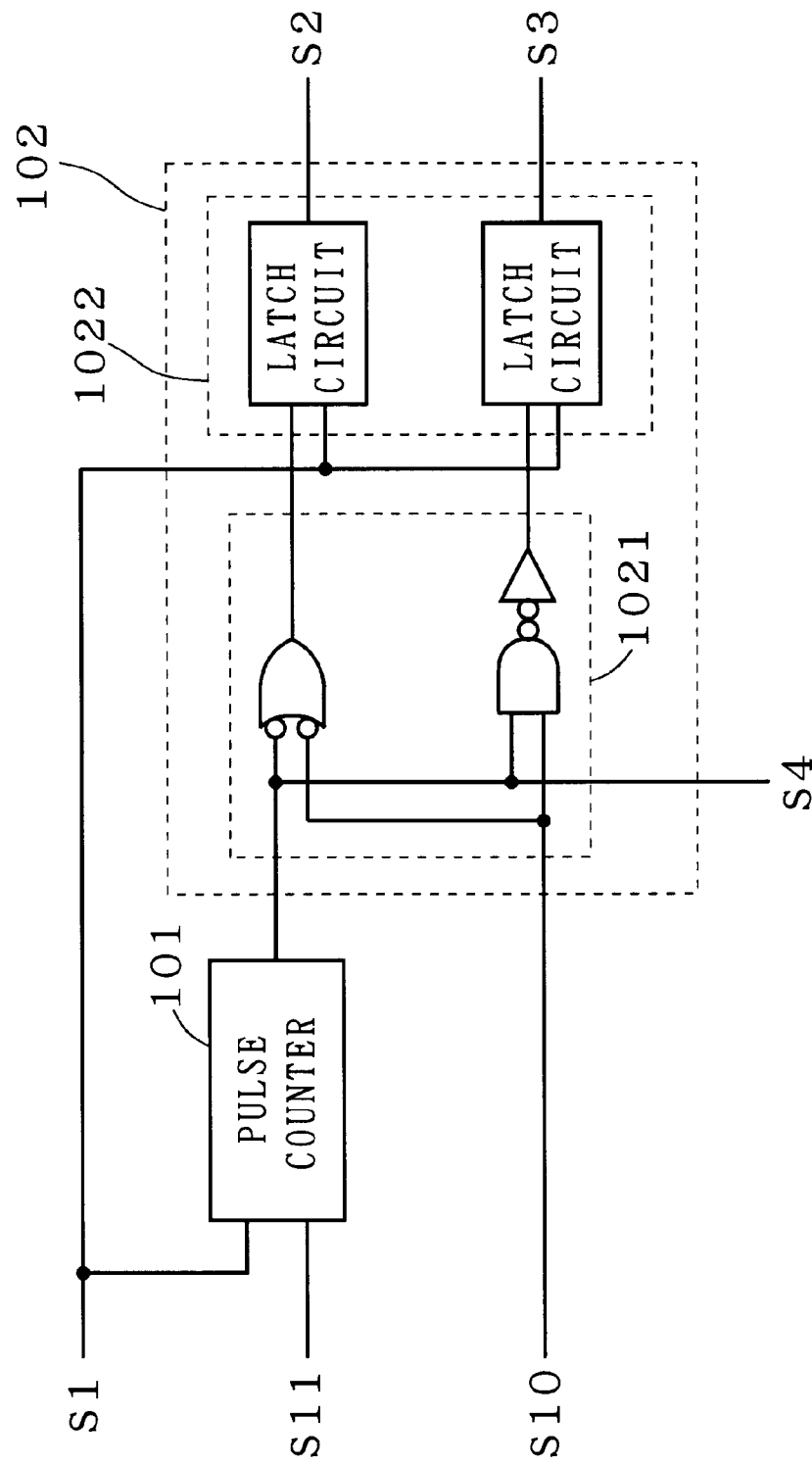
FIG. 3 is a circuit diagram showing an internal structure of a phase detector 100.

FIG. 3 shows an internal structure of the phase detector 100. The phase detector 100 comprises a pulse counter 101, and a pulse phase compare circuit (or pulse phase compare portion) 102. The pulse counter 101 receives the first clock signal S1 and the second clock signal S11 to detect whether the pulse count of the second clock signal S11 taken in one cycle of the first clock signal has reached a predetermined target value or not. The pulse phase compare circuit 102 receives the clock signal S4 which is the detected result of the pulse counter 101, the first clock signal S1 and the compare clock signal S10, and, if the pulse count reaches the target value, makes a phase comparison between the first clock signal S1 and the compare clock signal S10.

The pulse phase compare circuit 102 includes a combinational circuit 1021 and a latch circuit 1022. The pulse counter 101 receives the first clock signal S1 and the second clock signal S11, and outputs the clock stop signal S4. The combinational circuit 1021 receives the clock stop signal S4 and the compare clock signal S10. Receiving an output of the combinational circuit 1021, the latch circuit 1022 generates and outputs the result of the pulse phase compare circuit 102 as the first frequency-up signal S2 and the first frequency-down signal S3.

Figure 4:
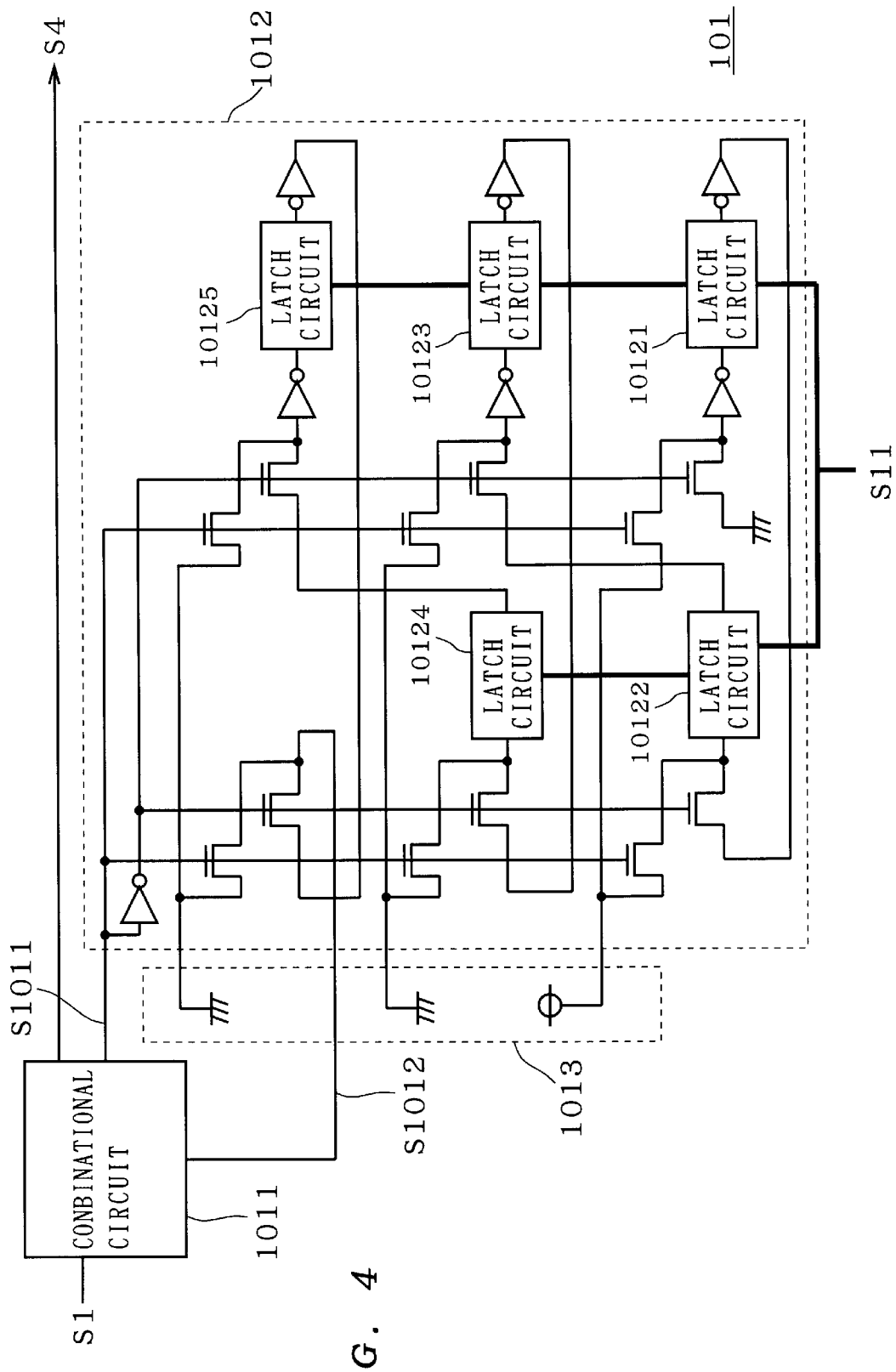
FIG. 4 is a circuit diagram showing an internal structure of a pulse counter 101.

FIG. 4 shows an internal structure of the pulse counter 101. The pulse counter 101 comprises a combinational circuit 1011, a shift register 1012 and a target value setting portion 1013. The shift register 1012 includes latch circuits 10121 through 10125.

When receiving a "1" level of the first clock signal S1, the combinational circuit 1011 outputs a "1" level of a signal S1011 and a "1" level of the clock stop signal S4. Further, when receiving a "1" level of a signal S1012, the combinational circuit 1011 outputs a "1" level of the clock stop circuit S4.

With a "1" level of the signal S1011 received, the shift register 1012 obtains a target value (three in this case) from the target value setting portion 1013. When the pulse count of the second clock signal S11 is counted up to three after the target value is obtained, the shift register 1012 outputs a "1" level of the signal S1012 because of overflow of the shift register.

In this way, when receiving a rising edge of the first clock signal S1, the pulse counter 101 outputs a "0" level of the clock stop signal S4 to start detecting the pulse count of the second clock signal S11. Then, when detecting that the pulse count of the second clock signal S11 becomes equal to the predetermined target value, the pulse counter 101 shifts the level of the clock stop signal S4 from "0" to "1".

Moreover, the operation of the pulse phase compare circuit 102 will be described in detail. The combinational circuit 1021 outputs the compare clock signal S10 and its inversed level of signal only when the clock stop signal S4 is at a "1" level. When receiving a rising edge of the first clock signal S1, the latch circuit 1022 receives two outputs from the combinational circuit 1021, and outputs them as the first frequency-up signal S2 and the first frequency-down signal S3.

In this way, when the clock stop signal S4 is at a "1" level, that is, when the pulse count of the second clock signal S11 reaches the target value, the pulse phase compare circuit 102 makes a phase comparison between the first clock signal S1 and the second clock signal S11 at a rising edge of the first clock signal S1.

Figure 5:
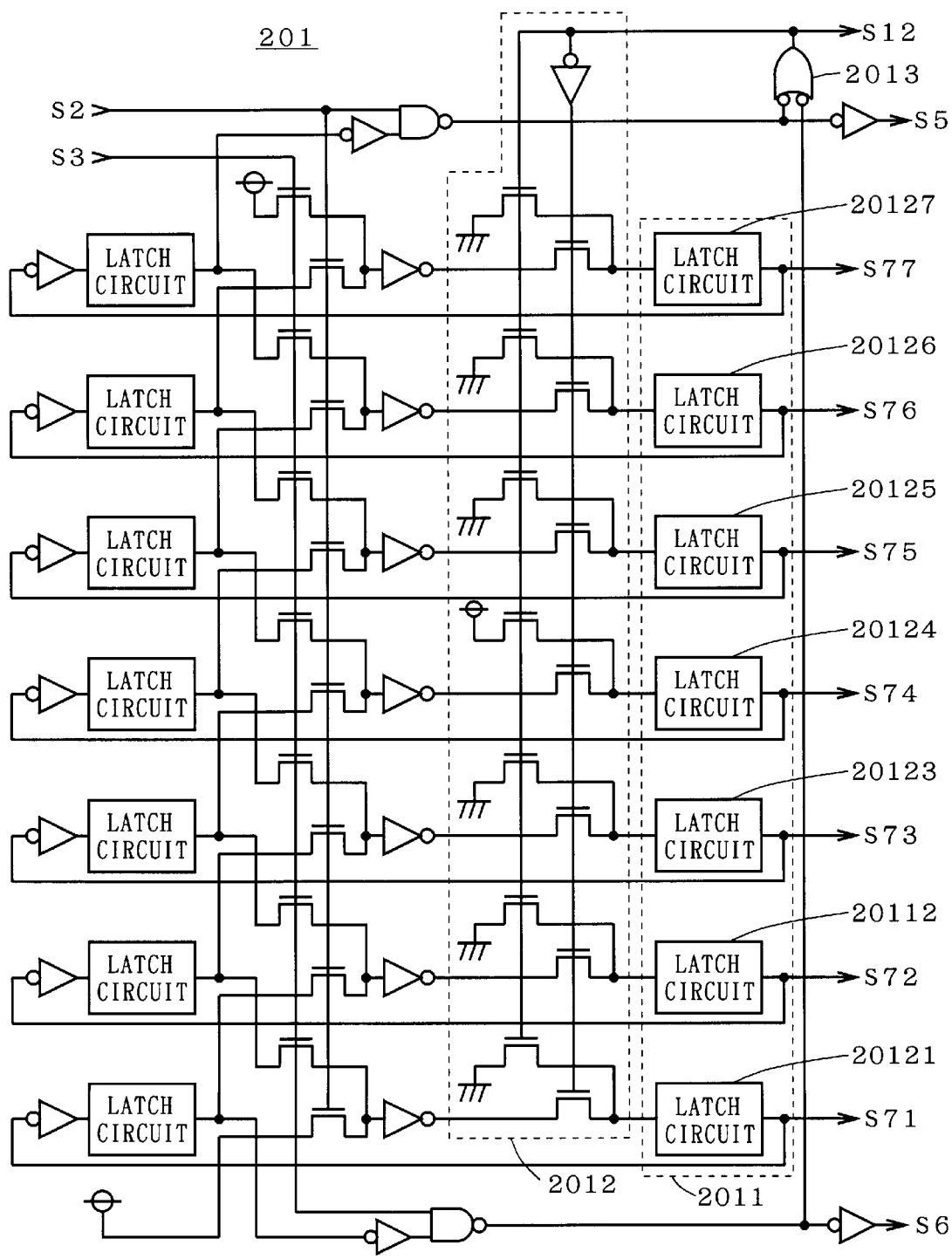
FIG. 5 is a circuit diagram showing an internal structure of a first control circuit 201.

FIG. 5 shows an internal structure of the first control circuit 201. The first control circuit 201 comprises a first up-down counter 2011 for either counting up or down to output the low-order signal S7 (S71 through S77) indicative of the lower digit of the count value, an initial value setting portion 2012 for setting the lower digit of the count value to a predetermined initial value when the lower digit overflows, and an interrupt signal output portion 2013 for outputting an interrupt signal S12 for generating an interruption in the chip 10. The initial value in the initial value setting portion 2012 is variable.

The first up-down counter 2011 includes latch circuits 20121 through 20127.

The first up-down counter 2011 obtains an initial value from the initial value setting portion 2012 when outputting a "1" level of the second frequency-up signal S5 and a "1" level of the second frequency-down signal S6. The initial value is set such that only the latch circuit 20124 takes a "1" level and the other latch circuits takes a "0" level.

Either one of the low-order signals S71 through S77 is set to a "1" level. Every time a "0" level of the first frequency-up signal S2 and a "1" level of the first frequency-down signal S3 are received, the first control circuit 201 counts up by shifting a bit in the direction from the low-order signals S71 to S77. On the other hand, every time a "1" level of the first frequency signal S2 and a "0" level of the first frequency signal S3 are received, the first control circuit 201 counts down by shifting a bit in the direction from the low-order signals S77 to S71.

Each of the latch circuit 20121 through 20127 outputs a bit therein as the signals S71 through S77, respectively.

If the first up-down counter 2011 counts up with the latch circuit 20127 storing a "1" level of bit, the "1" level of bit is outputted as a "1" level of the interrupt signal S12. When the first up-down counter 2011 counts down with the latch circuit 20121 storing a "1" level of bit, the "1" level bit is outputted as a "1" level of the interrupt signal S12. In this way, shifting a "1" level of bit from the first up-down counter 2011 to the interrupt signal output portion 2013 is called an overflow.

Figure 6:
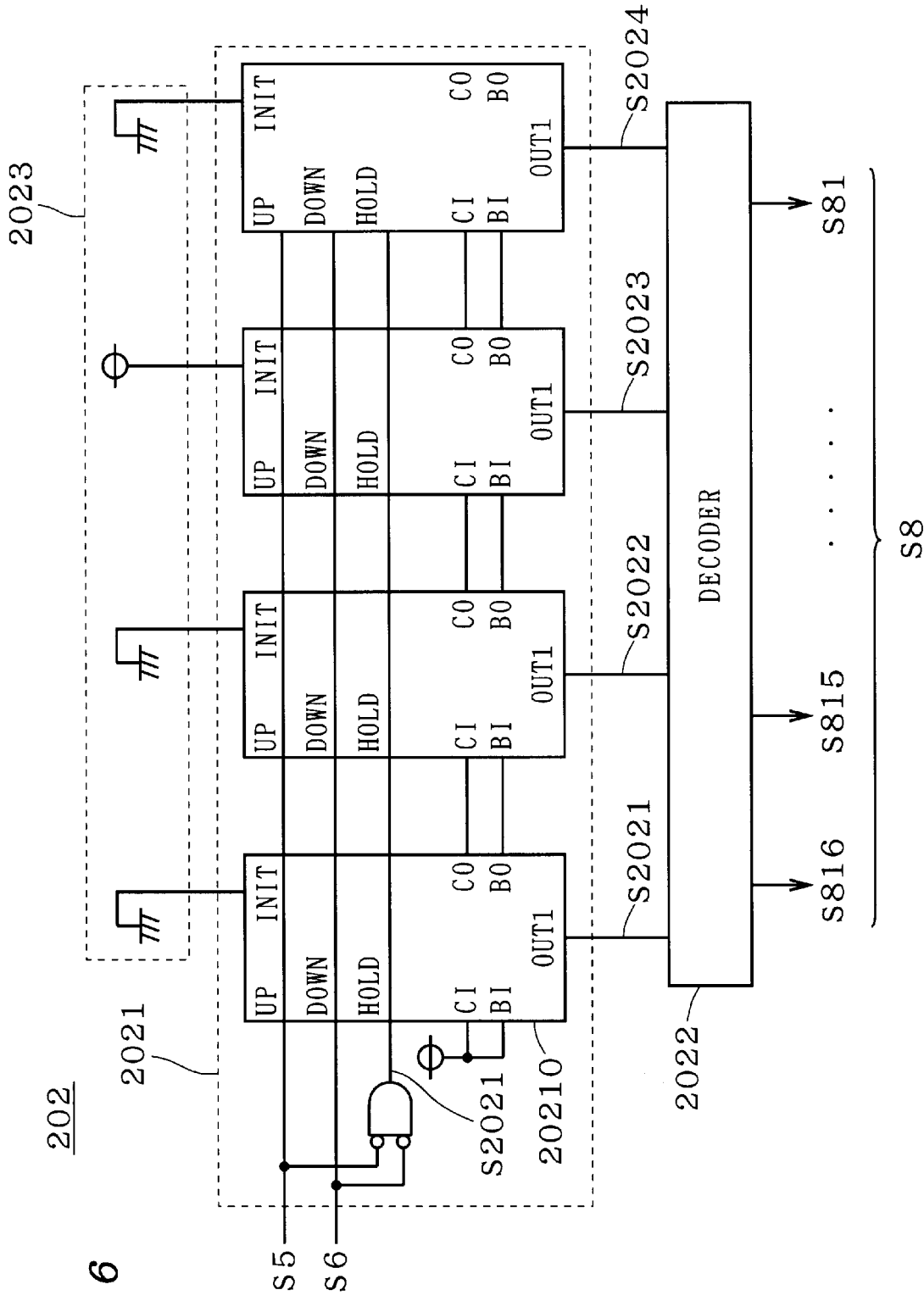
FIG. 6 is a circuit diagram showing an internal structure of a second control circuit 202.

FIG. 6 shows an internal structure of the second control circuit 202. The second control circuit 202 comprises a 4-bit second up-down counter 2021 for either counting up or down, a decoder 2022 for decoding an output of the second up-down counter 2021 to the high-order signal S8 (S81 through S816) indicative of the upper digit of the count value, and an initial value setting portion 2023 for setting an initial value of the second up-down counter 2021. Here, the initial value in the initial value setting portion 2023 is variable.

The second up-down counter 2021 includes four 1-bit counter circuits 20210 each having the same internal structure. When a first frequency-up signal S2021 is at a "1" level, each of the 1-bit counter circuit 20210 fixes the value at a terminal OUT.

Figure 7:
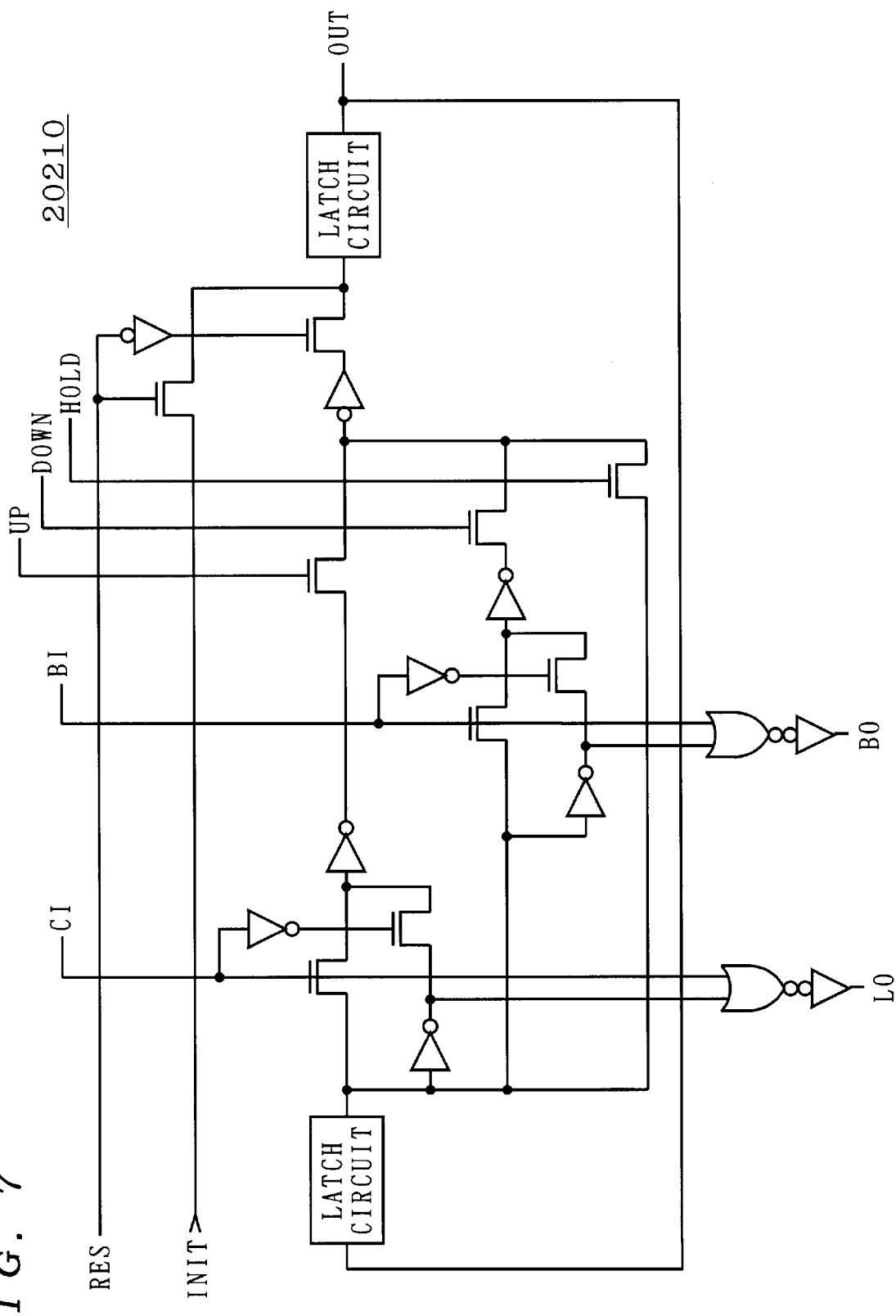
FIG. 7 is a circuit diagram showing an internal structure of a 1-bit counter circuit 20210.

FIG. 7 shows an internal structure of the 1-bit counter circuit 20210. The reference characters in this figure correspond to those in FIG. 6, respectively. The reference character RES indicates a terminal for inputting a reset signal from outside of the digital PLL circuit 1. When receiving a "1" level of the reset signal at the input terminal RES, the second up-down counter 2021 obtains an initial value from the initial value setting portion 2023.

Every time a "0" level of the second frequency-up signal S5 and a "1" level of the second frequency-down signal S6 are received, the second up-down counter 2021 counts up. On the other hand, every time a "1" level of the second frequency-up signal S5 and a "0" level of the second frequency-down signal S6 are received, the second up-down counter 2021 counts down.

The decoder 2022 receives four bits consisting of first frequency-up signals S2021 through S2024, and outputs the high-order signals S81 through S816 by decoding those bits.

Only one of the high-order signals S81 through S816 is at a "1" level. Thus, every time a "0" level of the second frequency-up signal S5 and a "1" level of the second frequency-down signal S6 are received, the second control circuit 202 counts up by shifting a bit in the direction from the high-order signals S81 to S816. On the other hand, every time a "1" level of the second frequency-up signal S5 and a "0" level of the second frequency-down signal S6 are received, the second control circuit 202 counts down by shifting a bit in the direction from the high-order signals S816 to S81.

Figure 8:
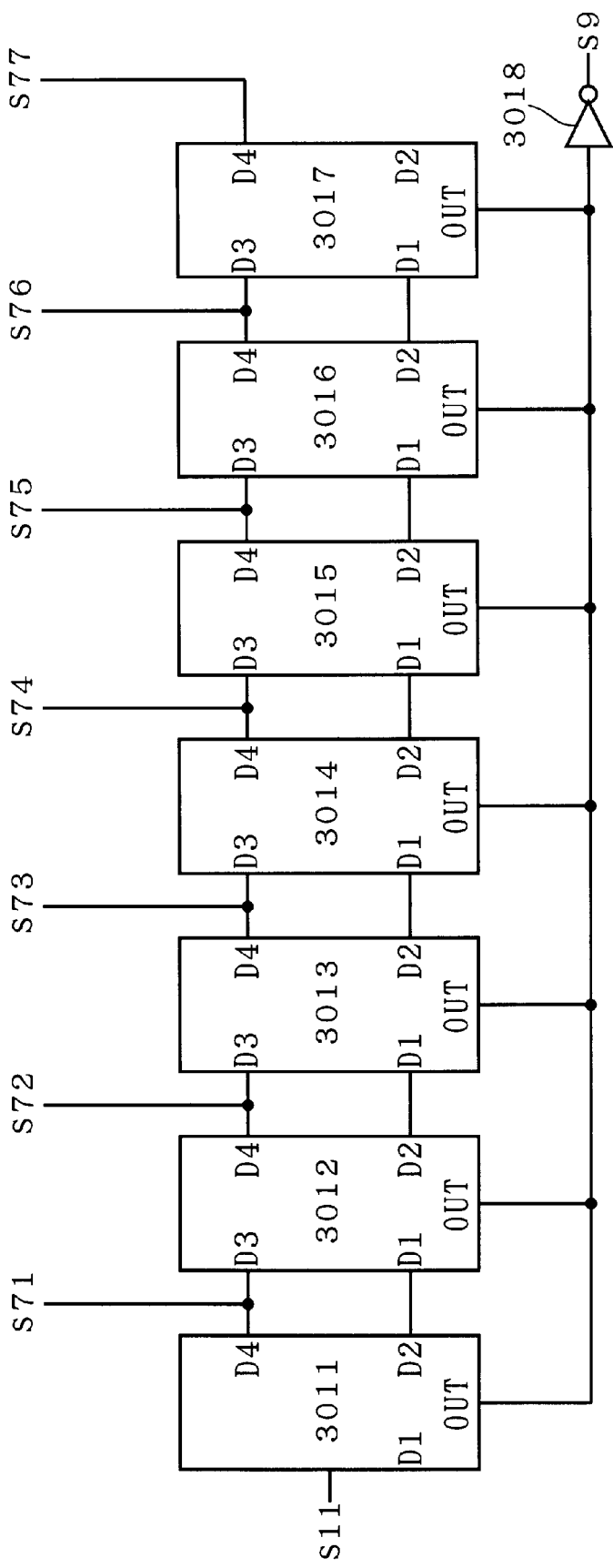
FIG. 8 is a circuit diagram showing an internal structure of a first delay line 301.

FIG. 8 shows an internal structure of the first delay line 301. The first delay line 301 comprises a plurality of serially connected first delay portions 3011 through 3017.

When the low-order signal S71 is at a "1" level, only the first delay portion 3011 is selected. When the low-order signal S72 is at a "1" level, the first delay portions 3011 and 3012 are selected. In this manner, when the low-order signal S77 is at a "1" level, the first delay portions 3011 through 3017 are selected. Through the selected first delay portion(s) and an inverter 3018, the second clock signal S11 is outputted as the signal S9.

Figure 9:
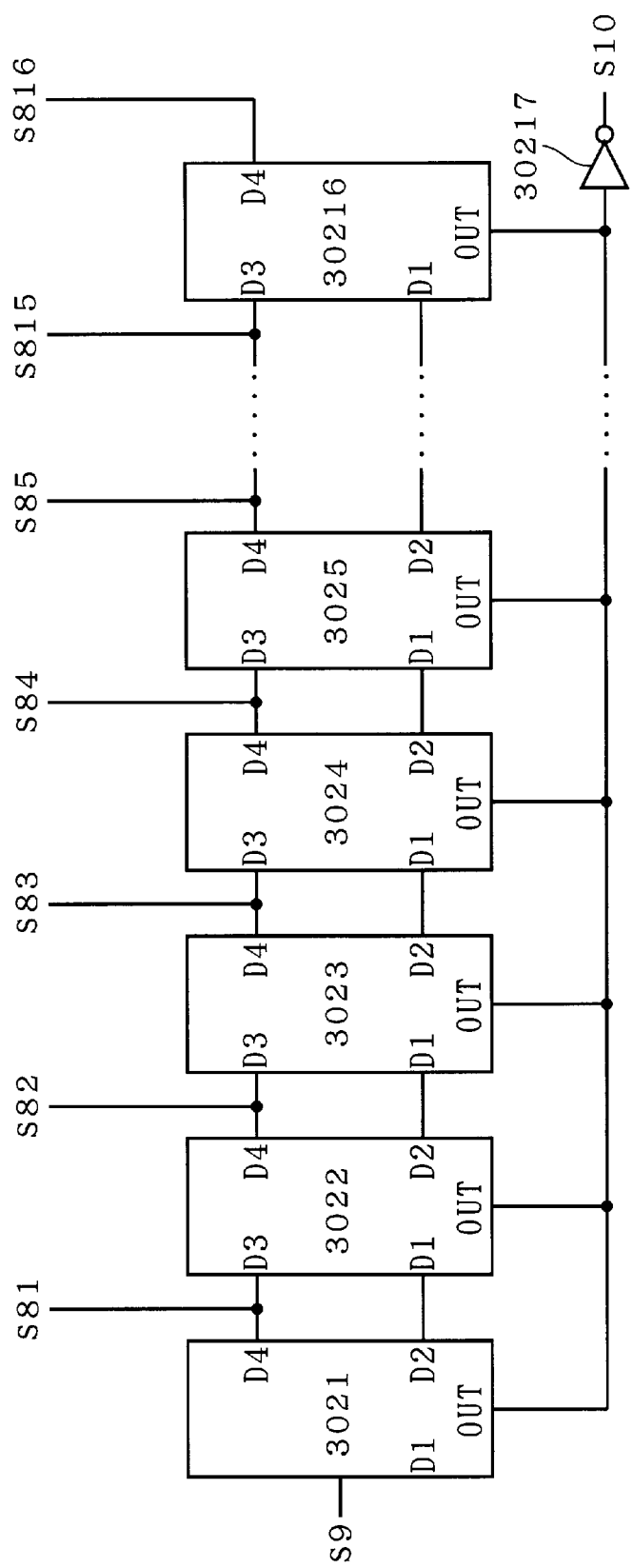
FIG. 9 is a circuit diagram showing an internal structure of a second delay line 302.

FIG. 9 shows an internal structure of the second delay line 302. The second delay line 302 comprises a plurality of serially connected second delay portions 3021 through 30216.

When the high-order signal S81 is at a "1" level, only the second delay portion 3021 is selected. When the high-order signal S82 is at a "1" level, the second delay portions 3021 and 3022 are selected. In this manner, when the high-order signal S816 is at a "1" level, the second delay portions 3021 through 30216 are selected. Through the selected second delay portion(s) and an inverter 30217, the signal S9 is outputted as the compare clock signal S10.

The delay object signal (S11, S9) does not pass through the first and second delay portion(s) not selected in the above cases.

Figure 10:
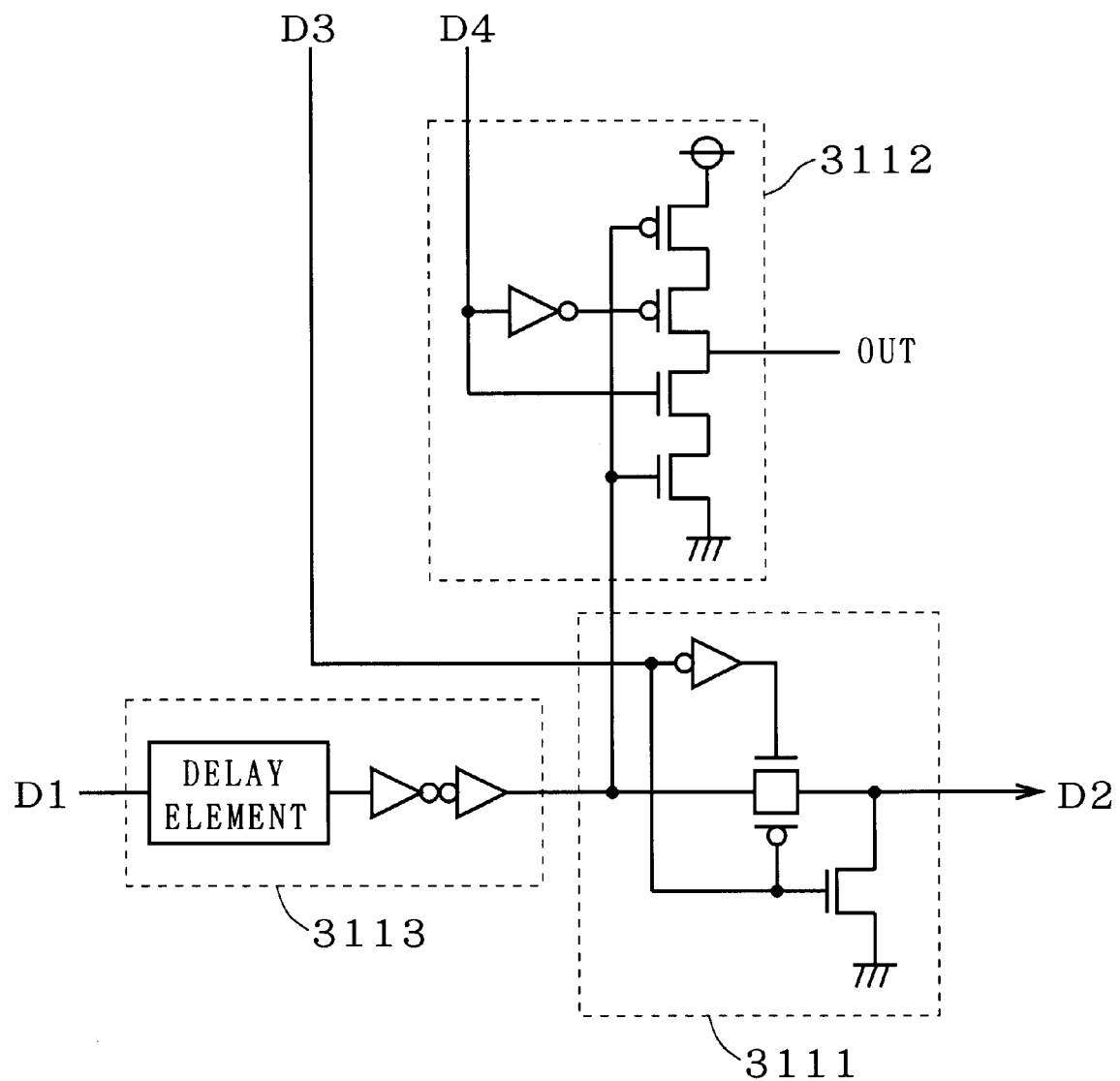
FIG. 10 is a circuit diagram showing an internal structure of a delay means.
Figure 11:
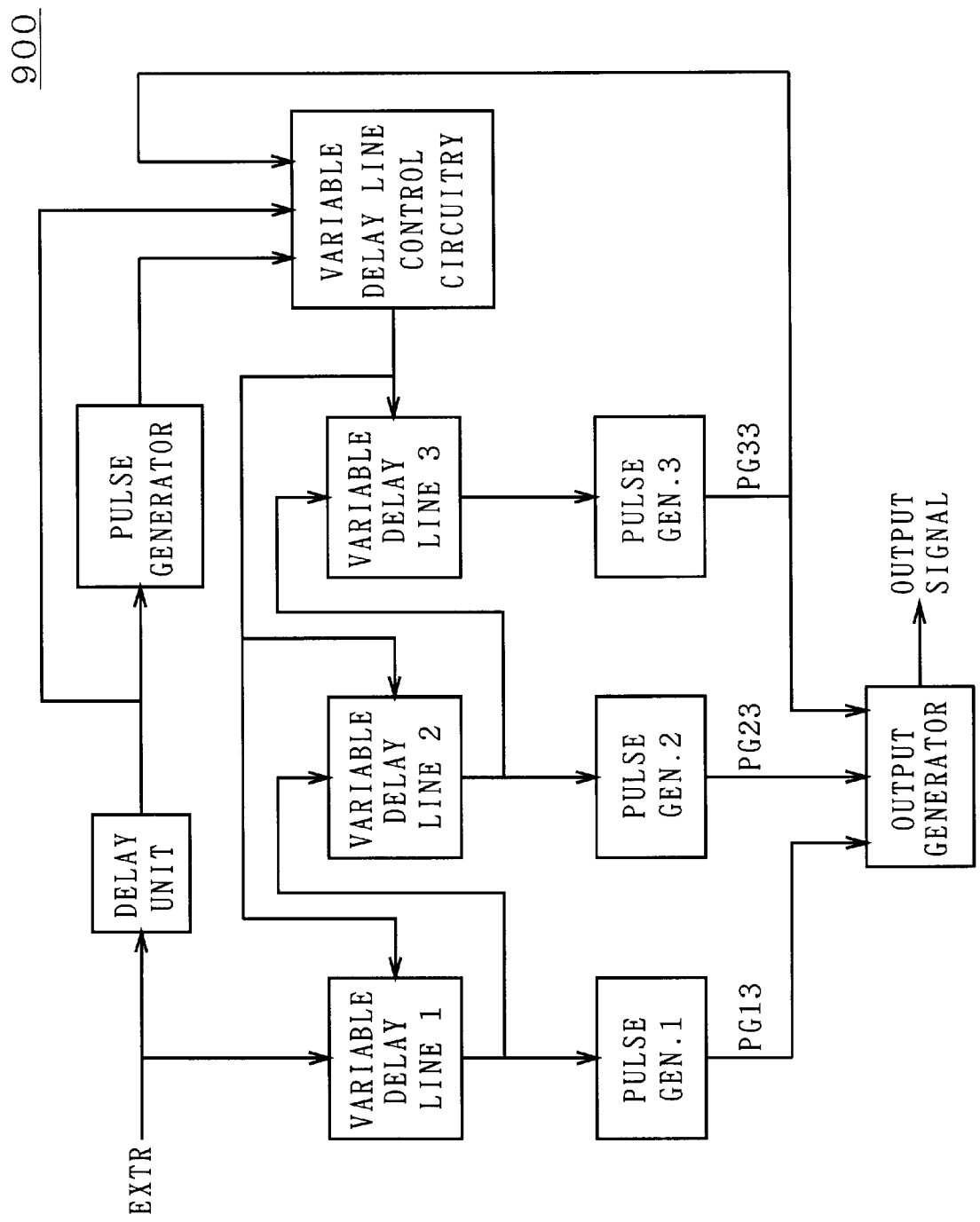
FIG. 11 is a circuit diagram showing a conventional digital PLL circuit 900.

FIG. 10 shows an internal structure of one of the delay portions of the first and second delay lines 301 and 302. The reference numerals D1, D2, D3, D4, and OUT in this figure correspond to those in FIGS. 8 and 9. The delay portion includes a potential fixing portion 3111 for fixing an input potential (potential of the terminal D1) of the first and second delay portions through which the delay object signal does not pass, an output portion 3112, and a delay portion 3113.

The amount of delay in the delay portion 3113 of the first delay portion is referred to as a first delay unit. The first delay unit of each first delay portion, 3011 through 3017, is the same. The amount of delay in the delay portion 3113 of the second delay portion is referred to as a second delay unit. The second delay unit of each second delay portions, 3021 through 30216, is the same. One second delay unit corresponds to four first delay units. Further, the amount of delay in the delay portion 3113 can be determined by either one of a delay element or a delay inverter, or a combination of the delay element and the delay inverter.

Since the first delay portion 3011 in the first delay line 301, and the second delay portion 3021 in the second delay line 302 have no potential fixing portion 3111, the outputs of their delay portions 3113 correspond to the node D2.

The delay portion 3113 delays a signal at the node D1, and outputs the signal to the potential fixing portion 3111 and the output portion 3112.

When a signal at the node D3 is at a "0" level, the potential fixing portion 3111 outputs an output signal of the delay portion 3113 to the node D2; when a signal at the node D3 is at a "1" level, the potential fixing portion 3111 outputs a signal fixed at a "0" level to the node D2. When a signal at the node D4 is at a "0" level, the output portion 3112 makes the node OUT high-impedance; when a signal at the node D4 is at a "1" level, the output portion 3112 outputs an inversed level of the output signal of the delay portion 3113 to the node OUT.

Referring back to FIG. 2, the operations of the control circuit 200 and the delay line 300 will be further described in detail. From the time T1 to T5, the control circuit 200 outputs the low-order signal S7 and the high-order signal S8 indicative of a count value for increasing the amount of delay for every cycle of the first clock signal S1.

From the time T1 to T2, only the low-order signal S76 out of the low-order signal S7, and the high-order signal S83 out of the high-order signal S8 are at a "1" level. Thus, the second clock signal S11 is outputted as the signal S9 through the first delay portions 3011 through 3016 shown in FIG. 8, and then the signal S9 is outputted as the compare clock signal S10 through the second delay portions 3021 through 3023 shown in FIG. 9. If the amount of delay in one first delay portion of the first delay line 301 is considered one unit, the amount of delay of the delay line 300 in this case is 18 units.

In this case, each amount of delay of the delay line 300 is 19 units from the time T2 to T3, 20 units from the time T3 to T4, and 21 units from the time T4 to T5, respectively.

From the time T5 to the next rising edge of the first clock signal S1, the control circuit 200 outputs the low-order signal S7 and the high-order signal S8 indicative of a count value for decreasing the amount of delay. Thus, the amount of delay of the delay line 300 in this period is 20 units.

As described above, the delay line 300 passes the delay object signal through the first delay portion(s) for the number indicated by the low-order signal S7 and the second delay portion(s) for the number indicated by the high-order signal S8, to output the delay object signal.

We will now describe the effect of the preferred embodiment of the present invention. Since one second delay unit of the second delay portion corresponds to four first delay units of the first delay portion, the number of delay portions in the delay line 300 can be reduced, which reduces the size of the circuit.

The amount of delay of the delay line 300 can be altered by changing an initial value in the initial value setting portion 2012. In FIG. 5, for example, the amount of delay of the delay line 300 can be reduced for every four first delay units by setting an initial value such that only the latch circuit 20121 stores a "1" level of bit.

The amount of delay of the delay line 300 can be increased or reduced for every first delay unit by setting an initial value of the initial value setting portion 2012 to the middle of the first up-down counter 2011, that is, such that the lower digit overflows when changed by four from the initial value.

The size of the circuit can be reduced by forming the control circuit 200 of the first control circuit 201 and the second control circuit 202. For example, the first control circuit 201 formed of the shift register achieves a rapid-response of the low-order signal S7 to the first frequency-up signal S2 and the first frequency-down signal S3; the second control circuit 202 formed of the up-down counter and the decoder reduces the size of the circuit.

Since the potential fixing portion 3111 fixes an input potential of the unused first and second delay portions which do not the delay object signal, power consumption can be reduced.

The digital PLL circuit 1, which employs the digital delay circuit comprising the control circuit 200 and the delay line 300, reduces the size of the circuit and power consumption. Specifically, considering a high power consumption in the general PLL circuit, the presence of the digital control circuit brings about substantial reduction in power consumption in the PLL circuit.

The pulse counter 101 enables generation of the second clock signal S11 dividing the cycle of the first clock signal S1 as well as simplifies the main part of the phase detector 100 for making the phase comparison, as shown in FIG. 3.

The phase compare circuit 102 brings about higher accuracy in the phase comparison when the phase of the second clock signal S11 follows the phase of the first clock signal S1.

The clock signal stop circuit 400 fixes a phase when the pulse count of the second clock signal S11 reaches the target value, so that the pulse phase compare circuit 102 can make a phase comparison with high accuracy.

The second frequency-up signal S5 and the second frequency-down signal S6 are used so that the interrupt signal output portion 2013 can be formed of a simple circuit such as an OR circuit of a minus input.

A bad influence on operation of the chip 10 due to a rapid change in the cycle of the second clock signal S11 can be prevented in advance by outputting the interrupt signal when the upper digit changes by taking a count. This is especially effective if the initial value of the initial value setting portion 2012 is not set in the middle of the first up-down counter 2011.

<Modification>

The shift register shown in FIG. 4 is a 5-bit register, but the number of bits is variable. Moreover, though the target value of the target value setting portion 1013 is fixed, if variable, the number into which the second clock signal S11 divides the cycle of the first clock signal S1 can be altered.

While the invention has been described in detail, the foregoing description is in all aspects illustrative and not restrictive. It is understood that numerous other modifications and variations can be devised without departing from the scope of the invention.

We claim:

1. A digital delay circuit comprising:
    a control circuit receiving a digital signal which changes an amount of delay, and for taking a count in accordance with said digital signal to output a count value; and
    a delay line receiving a delay object signal and said count value, and comprising
        a first delay line including a plurality of first delay portions each having a first delay unit, and
        a second delay line including a plurality of second delay portions each having a second delay unit corresponding to a predetermined number of said first delay units,
    wherein said delay line passes said delay object signal through said first delay portions the number of which is indicated by a lower digit of said count value and through said second delay portions the number of which is indicated by an upper digit of said count value, to output said delay object signal, and
    wherein said delay line includes a potential fixing portion for fixing an input potential of only said first and second delay portions through which said delay object signal does not pass.

2. The digital delay circuit according to claim 1, wherein said control circuit comprises an initial value setting portion for setting said lower digit to a predetermined initial value when said lower digit overflows.

3. The digital delay circuit according to claim 2, wherein said initial value is such that said lower digit overflows when changed by said predetermined number from said initial value.

4. The digital delay circuit according to claim 1, wherein said control circuit comprises:
    a first control circuit receiving said digital signal, and for taking a count in accordance with said digital signal to output said lower digit, if said lower digit overflows, to output a control signal for selecting either to count up or down in count operation; and
    a second control circuit receiving said control signal, and for taking a count in accordance with said control signal to output said upper digit.

5. The digital delay circuit according to claim 4, wherein said first control circuit includes a first up-down counter for taking a count to output said lower digit; and
    said second control circuit includes a second up-down counter for taking a count to output said upper digit.

6. A digital PLL circuit receiving a first clock signal, and for generating a second clock signal which follows the phase of said first clock signal,
    said digital PLL circuit comprising:
        a digital delay circuit; and
        a phase compare portion receiving said first and second clock signals, and for making a phase comparison between said first and second clock signals to output the compared result as a digital signal which changes the amount of delay,
    said digital delay circuit comprising:
        a control circuit receiving said digital signal, and for taking a count in accordance with said digital signal to output a count value; and
        a delay line receiving a delay object signal and said count value, and comprising
            a first delay line including a plurality of first delay portions each having a first delay unit, and
            a second delay line including a plurality of second delay portions each having a second delay unit corresponding to a predetermined number of said first delay units,
    wherein said delay line passes said delay object signal through said first delay portions the number of which is indicated by a lower digit of said count value and through said second delay portions the number of which is indicated by an upper digit of said count value, to output said delay object signal; and
    wherein said delay object signal is said second clock signal and said delay object signal outputted by said delay line is inputted as said second clock signal to said delay line.

7. The digital PLL circuit according to claim 6, wherein said phase compare portion includes a pulse counter receiving said first and second clock signals, and for detecting whether a pulse count of said second clock signal taken in one cycle of said first clock signal reaches a predetermined target value to output a detected result, said phase compare portion generating said digital signal on the basis of the detected result of said pulse counter.

8. The digital PLL circuit according to claim 7, wherein said phase compare portion further includes a pulse phase compare portion receiving the detected result of said pulse counter, and said first and second clock signals, and for making a phase comparison between said first and second clock signals if said detected result of said pulse counter indicates that said pulse count reaches a predetermined target value, said phase compare portion generating said detected result of said pulse phase compare portion as said digital signal.

9. The digital PLL circuit according to claim 8, further comprising:
    a clock signal stop portion receiving said detected result, and for stopping said second clock signal in accordance with said detected result.

10. The digital PLL circuit according to claim 6, wherein said control circuit comprises an interrupt signal output portion for outputting an interrupt signal for generating an interruption in a system equipped with said digital PLL circuit when said upper digit changes.

* * * * *